ated 9/15/87 XR 4,694,243

United States Patent [19]
Miller et al.

[11] Patent Number: 4,694,243
[45] Date of Patent: Sep. 15, 1987

[54] OPTICAL MEASUREMENT USING POLARIZED AND UNPOLARIZED LIGHT

[75] Inventors: Robert C. Miller, Salem Township, Westmoreland County; Juris A. Asars, Murrysville, both of Pa.

[73] Assignee: Westinghouse Electric Corp., Pittsburgh, Pa.

[21] Appl. No.: 868,224

[22] Filed: May 28, 1986

[51] Int. Cl.[4] .................. G01R 19/00; G01R 15/07; G01B 11/00
[52] U.S. Cl. ........................ 324/96; 350/370; 350/371; 350/374; 350/375; 350/384; 350/387; 356/364; 356/365
[58] Field of Search .................. 324/96, 244, 99 R; 350/370, 371, 374, 375, 376, 378, 384, 387, 389; 356/364, 365, 366, 367, 368

[56] References Cited
U.S. PATENT DOCUMENTS 4,147,979  4/1985  Baues et al. ................. 324/244
4,540,937  8/1985  Asars ........................ 324/96

FOREIGN PATENT DOCUMENTS 95998   12/1983  European Pat. Off. ......... 324/96
1137403  1/1985  U.S.S.R. ..................... 324/76 R

OTHER PUBLICATIONS

Measurement of Pressure by Photoelastic Effects, by: G. Martens.
Multimode Fiber-Optic Hydrophone Based on the Photoelastic Effect, by: W. B. Spillman, Jr., and D. H. McMahon.

Primary Examiner—Reinhard J. Eisenzopf
Assistant Examiner—Stephen M. Baker
Attorney, Agent, or Firm—Daniel C. Abeles

[57] ABSTRACT

Physical quantities such as pressures, accelerations and electrical currents including d-c currents are measured by alternately passing polarized and unpolarized light through an optical-sensor which modifies the polarization of the polarized light in proportion to the magnitude of the physical quantity while passing the unpolarized light unaltered by the physical quantity. The polarized and unpolarized light are generated by separate light sources which generate light at two different wavelengths and a polarizer which is effective to polarize light of the one wavelength but not the other. Light emerging from the sensor is converted into an electrical signal by an analyzer and a photodetector. The intensity of the light generated by the two sources is adjusted so that the electrical signal generated in response to the polarized light is substantially equal to that generated in response to the unpolarized light so that by subtracting the signal generated by the unpolarized light from that generated in response to the polarized light the component of the later proportional to the magnitude of the physical quantity is extracted. The subtraction is effected in an exemplary embodiment by comparing the electrical signal to a reference signal and adjusting the intensity of the unpolarized light to drive the difference between the electrical signal generated by the unpolarized light and the reference signal to zero, and then using the difference between the electrical signal generated by the polarized light and the reference signal as the output proportional to the magnitude of the physical quantity.

12 Claims, 6 Drawing Figures

OPTICAL MEASUREMENT USING POLARIZED AND UNPOLARIZED LIGHT

CROSS-REFERENCE TO RELATED APPLICATIONS

Our commonly owned U.S. patent application Ser. No. 717,989 filed on Mar. 29, 1985 and entitled "Drift Compensation Technique For A Magneto-Optic Current Sensor".

BACKGROUND OF THE INVENTION

1. Field of the Invention

This invention relates to optical sensors and methods of measuring in which the magnitude of a physical quantity is measured by the amount that it alters the polarization of light passed through a sensor; and in particular to elasto-optic sensors which can be used to measure stress induced by pressure or acceleration, and magneto-optic sensors which can be used to measure electric currents. More specifically, the invention is related to such sensors and methods which utilize two wavelengths of light, one of which is polarized and the other of which is unpolarized, with the optical signals multiplexed over a single pair of fiber optic cables and received by a single photodetector.

2. Prior Art

Optical sensors in which a physical quantity alters the polarization of light passed through the sensor element and converted to an electrical signal by a photodetector are well known. In the case of magneto-optic sensors, the electromagnetic field generated by an electric current rotates the plane of polarization of linerally polarized light passed through magneto-optic material. In elasto-optic sensors, stress induced in elasto-optic material by pressure or acceleration alters the polarization of circularly polarized light. To utilize this latter effect in the measurement of acceleration and pressure, the optical transmission changes in the sensor due to the photoelastic effect have to be separated from the variations due to other effects that cause changes in the photodetector current. Among the effects to be eliminated are variations in the light source efficiency, photodetector sensitivity and dark current as well as both long-term and vibration-induced variations in optical cable and connector losses. Similar signal separation is required for magneto-optic current transformers.

For both accelerometers and current transformers that are restricted to alternating current with bandpaths above frequencies associated with the undesirable variations, frequency discrimination can be used to accomplish the required separation as suggested in U.S. Pat. No. 4,540,937. For magneto-optic direct current transformers as well as for pressure sensors, the above simple method of signal separation can not be utilized. One separation method for the direct current transformers utilizing four optical fiber cables in conjuction with difference/sum calculations from light transmission by two orthogonal polarized light analyzers has been described in our commonly owned U.S. patent application Ser. No. 866,016 entitled "A Direct Current Magneto-Optic Current Transformer".

A second method of signal separation for magneto-optic direct current transformers utilizing two distinct wavelength light sources multiplexed over the same two fiber optic cables and incident on the same photodetector has been described in our commonly owned U.S. Pat. application Ser. No. 717,989 filed on Mar. 29, 1985. The difference in the Verdet coefficients of the magneto optic material at the two wavelengths permits calculations of the average magnetic field intensity and therefore current, as well as its variations, at frequencies below the multiplexing frequency. This approach can also be used for signal separation in elasto-optic pressure gages and accelerometers where the frequency of optical cable and connector vibrations within the desired passband present problems. While such multiple light wavelength elasto-optic accelerometer and pressure gage designs are believed to be satisfactory, a reduction in the complexity of the optical to electrical interface is desirable.

SUMMARY OF THE INVENTION

In accordance with the invention, the magnitude of a physical quantity is measured by alternately passing polarized and unpolarized light through an optical sensor which modifies the polarization of the polarized light in proportion to the magnitude of the physical quantity while passing the unpolarized light unaltered by the physical quantity. The light emerging from the sensor is converted into an electrical signal having, in response to the polarized light, a component proportional to the magnitude of the physical quantity. The intensities of the polarized light and unpolarized light are adjusted relative to each other such that the electrical signals generated thereby for a zero magnitude of the physical quantity are substantially equal. Under these conditions, the component proportional to the magnitude of the physical quantity is extracted from the electrical signal generated by the polarized light by subtracting from it the signal generated by the unpolarized light.

In the preferred embodiment, the polarized and unpolarized light are generated by two separate light sources which generate light at two different wavelengths. The light from both sources is passed through a polarizer which is effective to polarize light at one wavelength but not the other. A clock alternately energizes the two light sources so that polarized and unpolarized light are alternately passed through the optical sensor. For measuring pressure and acceleration, the polarizer circularly polarizes light of the one wavelength and the sensor is comprised of elasto-optic material. For measuring electrical currents, the polarizer linerally polarizes light of the one wavelength and magneto-optic material is used for the sensor.

In the exemplary analog circuits, the electrical signals generated in response to the polarized and unpolarized light are time demultiplexed and subtracted by determining the difference between each of them and a common reference signal, and making the electrical signal generated from the unpolarized light equal to the reference signal by regulation of the intensity of the unpolarize light through a feedback loop.

The invention embraces both the apparatus and method for measuring forces and electrical currents including dc currents which are uncomplicated yet provide compensation for all variations in the optical components.

BRIEF DESCRIPTION OF THE DRAWINGS

A full understanding of the invention can be gained from the following description when read in conjunction with the accompanying drawings in which.

DESCRIPTION OF THE PREFERRED EMBODIMENTS

Figure 1:
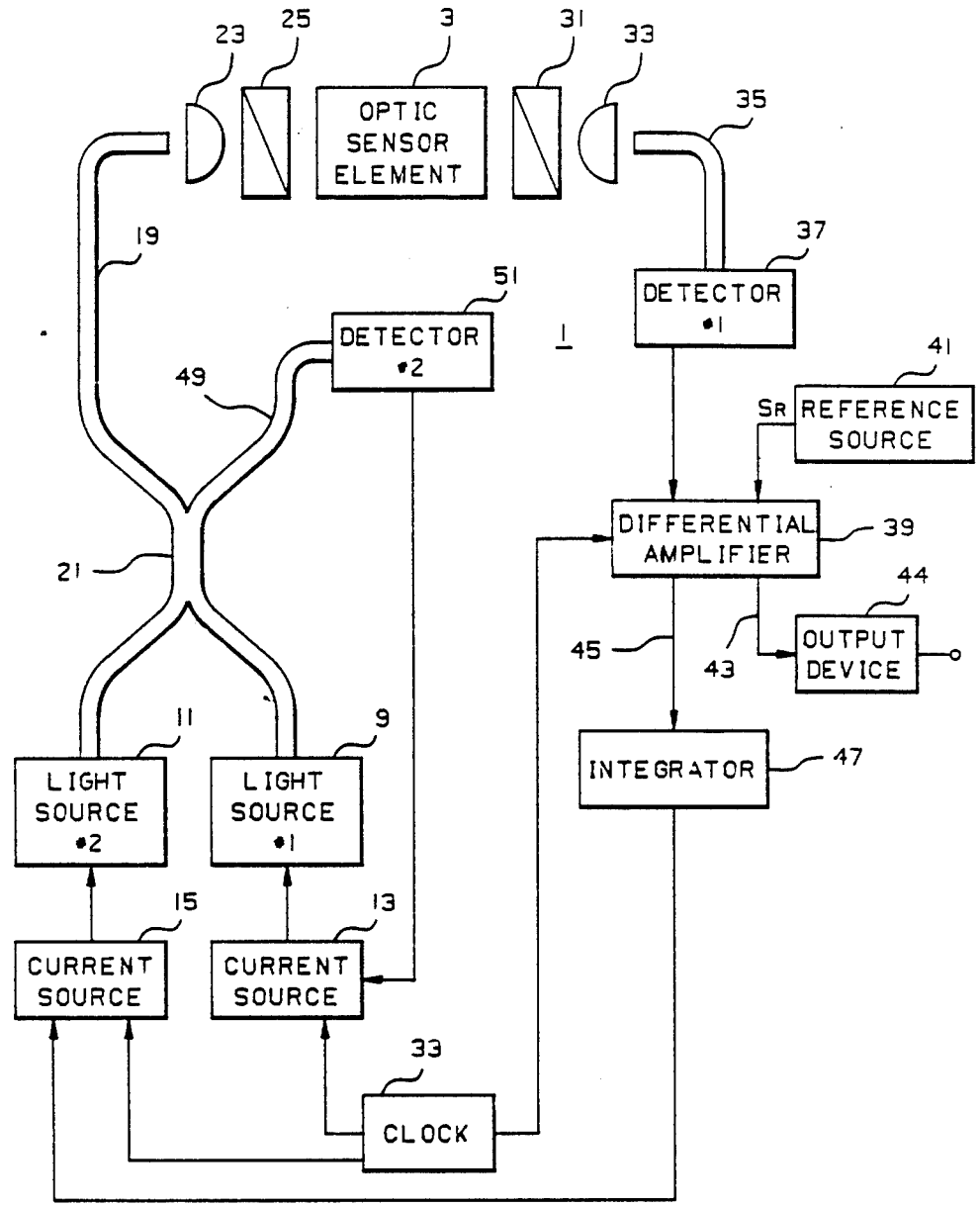
FIG. 1 is a block diagram of a measurement system in accordance with the invention.
Figure 2:
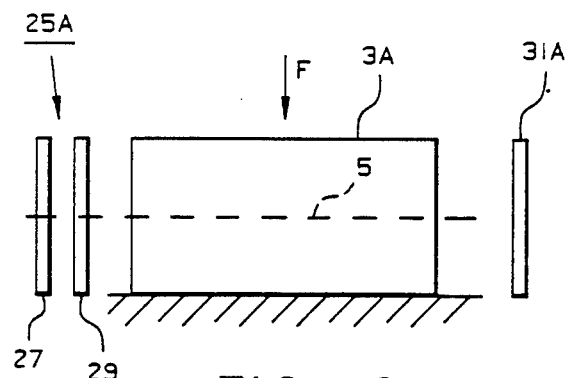
FIG. 2 is a schematic diagram of the arrangement of the optical components of the measurement system of FIG. 1, including an elasto-optic sensor, for application of the invention to the measurement of pressures and accelerations.
Figure 3:
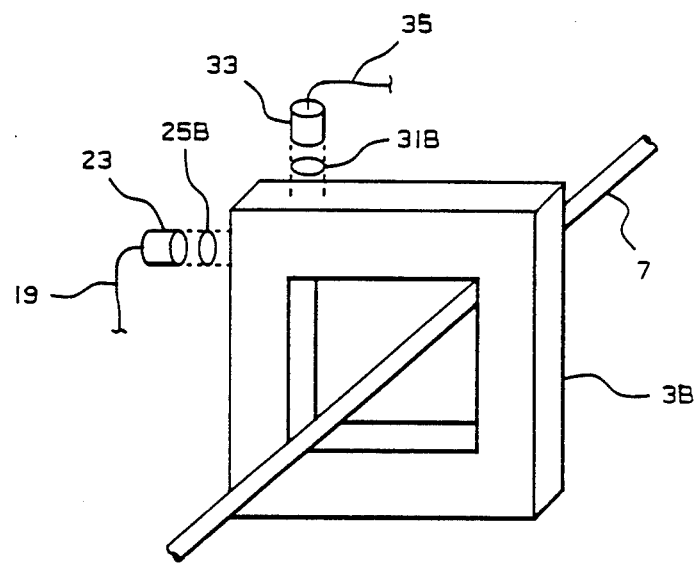
FIG. 3 is a schematic diagram of the arrangement of the optical components of the measurement system of FIG. 1, including a magneto-optic sensor, for application of the invention to the measurement of electrical currents.

FIG. 1 illustrates the measurement system according to the invention in block diagram form. The heart of the system is an optic sensor element 3. This element may be an elasto-optic element 3A as shown in FIG. 2. Bicefringence caused by stress in the sensor element 3A acting in response to a force F along an axis transverse to the path 5 of a beam of circularly polar light causes the circular polarization to become elliptical in response to the magnitude of the stress. The stress may be induced, for instance, by acceleration or pressure. The sensor element may also be a magneto-optic element 3B such as shown in FIG. 3. The magnetic field generated by a current passing through the conductor 7 rotates the plane of polarization of linearly polarized light passing through the sensing element by an amount proportional to the magnitude of the current. Other shapes of the sensing element 3B can be used to detect the current in conductor 7, but by using an element which passes the light 360 around the conductor as shown, the relative placement of the element and the conductor passing through the element is not critical.

In order to construct an optical sensor which is stable over an extended period of time, it is necessary to compensate for variations in the light transmission characterization of the optical components. The problem is more difficult in the case of measuring dc currents, pressures and low frequency accelerations where the frequency of the disturbances are in the same band as the variations in the magnitude of the quantity to be measured. The present invention overcomes these difficulties by alternately passing polarized and unpolarized light through the optical components. The polarization of the polarized light is affected by an amount proportional to the strength of the physical quantity to be measured while the unpolarized light is unaffected. The polarized and unpolarized light is generated by two light sources 9 and 11 such as light emitting diodes (LEDs) which generate light at two different wavelengths, $\lambda_1$ and $\lambda_2$, respectively. The light sources 9 and 11 are energized by current sources 13 and 15 respectively. These current sources are alternately activated by a control device in the from of a clock 17 so that one, but only one LED, is turned on at a time. Preferably, the two LEDs are turned on in turn for intervals of equal duration.

Light from the two light sources 9 and 11 is introduced into a fiber optic light guide 19 by an optical coupler 21 for transmission to the sensor 3. The use of the light guide 19 permits the light sources and their associated electronics to be located remotely from the site of the measurement. This is especially useful in applications where the measurement must be made in a harsh environment, such as in a nuclear reactor, for instance, where prolonged radiation has an adverse effect on the electronics, but not on the optical components.

Diverging light emerging from the light guide 19 is converted to parallel light by collimating lens 23 for introduction into a polarizer 25. The polarizer 25 is selected to provide linear polarization in the case of a magneto-optic sensor 3B and circular polarization for an elasto-optic sensor 3A. In either case, the polarizer is effective to provide the appropriate polarization to light of the first wave length $\lambda_1$ from the first light source 9, but is ineffective to polarize light of the second wavelength $\lambda_2$ from the second light source 11. This can be achieved by a narrow spectrum polarizer which is effective at $\lambda_1$ but not $\lambda_2$. For instance, using LEDs which generate light at wavelengths at 810 and 1000 millimicrons for the first and second light sources 9 and 11 respectively, polarizing film 25B designated HN7 by the manufacturer Polariod Corporation will effectively linearly polarize the light from source 9 but not from source 11. Similarly, a narrow spectrum circular polarizer could be used to circularly polarize light from the source 9 but not from the source 11. The same results could be achieved by using a linear polarizer 27, such as the HN7 mentioned above, in combination with a ¼ wave plate 29 for light of the wavelength $\lambda_1$, from source 9 which is a ½ wave plate for light of wavelength $\lambda_2$ from source 11. Light of the wavelength $\lambda_1$ will be circularly polarized while light of wavelength $\lambda_2$ will not. Even if the light of wavelength $\lambda_2$ is linearly polarized, it will be unaffected by the magnitude of the stress in the sensor since birefringence in the elasto-optic material does not affect linearly polarized light. Thus, the polarization of the light of wavelength $\lambda_2$ would be ineffective, and attenuation of light from the source 11 would be independent of the magnitude of the pressure or acceleration being measured.

Figure 4:
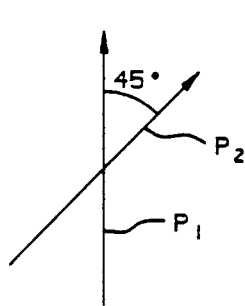
FIG. 4 is a diagram illustrating the orientation of the polarization axes of the polarizer and analyzer which are two of the optical components illustrated in FIG. 3.
Figure 5:
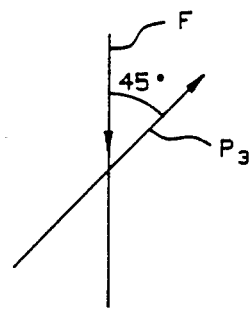
FIG. 5 is a diagram illustrating the orientation of the axis of polarization of the analyzer which is one of the components illustrated in FIG. 2 and the direction of the force applied to the elast-optic-sensor element by the pressure or acceleration.

Light emerging from the sensor 3 is passed through an analyzer 31 which is also a polarizer. In the case of the magneto-optic sensor 3B, the analyzer 31B is a linear polarizer, such as the HN7 film used in polarizer 25B, but with its axis of polarization $P_2$ rotated, preferably at an angle of 45° as shown in FIG. 4, with respect to the polarization axis $P_1$ of the polarizer 25. The analyzer 31A comprises a linear polarizer oriented with its polarization axis, $P_3$, at an angle, preferably 45°, to the axis of the force F creating the stress in the sensor 3A, as shown in FIG. 5.

Light emerging from the analyzer 31 is focused by a lens 33 into a fiber optic light guide 35 which conducts the light to a photodetector 37. The photodetector 37 converts the incident light into an electrical signal, specifically a current signal $S_1$ in response to light from source 9, and $S_2$ in response to light from source 11. It is well known in the case of an elasto-optic sensor such as 3A, that:

$$S_1 = S'(1 + kF)$$

where S' is the magnitude of the signal generated in response to light from source 9 in the absence of stress in the sensor, F is the force applied to the sensor and k is a proportionality constant.

Since light of wavelength $\lambda_2$ is unaffected by the force F, $S_2 = S''$ equals the magnitude of the detector signal generated in response to light from source 11 passed through the sensor.

The electrical signals $S_1$ and $S_2$ are separately compared in a differential amplifier 39 with a reference signal, $S_R$, generated by a reference source 41. The clock 33 demultiplexes the signals $S_1$ and $S_2$ by alternately switching the difference between the electrical signal generated by the detector 37 and the reference signal $S_R$, between leads 43 and 45 in synchronism with the activation of light sources 9 and 11. The difference between $S_2$ and $S_R$ is fed back through an integrator 47 to current source 15 which controls the intensity of the light source 11. The integrator 47 provides an offset which permits adjustment of the intensity of the light generated by light source 11 to drive the differences between $S_2$ and $S_R$ to zero. In other words, $S_2$ is made equal to $S_R$ so that:

$$S_2 = S_1 = S_R$$

If the intensity of the light from the light source 9 is made equal to the intensity of light from source 11, then:

$$S' = S'' = S_R$$

and $$S_1 = S_R(1 + kF)$$

During the intervals that the source 9 is activated, the clock switches the difference signal generated by the differential amplifier 39 to the output lead 43 to produce an output signal which is the difference between $S_1$ and $S_R$ and
hence:

$$S_o = S_1 - S_R$$
$$= S_R(1 + KF) - S_R$$
$$= S_R kF$$

which it can be seen is proportional to the magnitude of the force applied to the sensor. An output device 44 generates a continuous output signal $S_o$.

The intensity of the input light from the two light sources is adjusted by directing light from the coupler 21 through a fiber optic light guide 49 to a second photodetector 51 which compares the intensity of the light produced sequentially by the two sources 9 and 11 and regulates the current source 13 to adjust the intensity of the light generated by light source 9 relative to that generated by light source 11. The gain of detector 51 is selected to offset the intensity of light source 9 to accomodate for the difference in attenuation of the light from the two sources in passing through the optical components so that the signals generated by the detector 37 in response to light from sources 9 and 11 are equal in the absence of a force F on the sensor. Since attenuation of the light from the two sources remains proportional with changing conditions in the optical components, a constant gain setting for the detector 51 provides accurate measurements over the operating range of the sensor.

Thus it can be appreciated that the system of FIG. 1 zeroes out the carrier signal by subtracting the signal which is not affected by stress in the sensor from that generated by the polarized light to extract the component proportional to the applied force. The subtraction of the analog signals is implemented by sequentially making the two signals equal to the same reference signal.

For measuring electric currents where the sensor 3B is a magneto-optic device, the signal received by the detector 37 in response to the polarized light is:

$$S_1 = S_o(1 + \sin 2\theta) = S_o(1 + 2VI)$$

where $\theta$ equals the small angle through which the plane of the linearly polarized light is rotated due to the Faraday effect, V is the Verdet constant of the magneto-optic material, and I is the magnitude of the current. Again $S_o$ is subtracted out by making the effective intensity of the two light sources equal, making $S_2$ equal to $S_R$ and subtracting $S_R$ from $S_1$.

Figure 6:
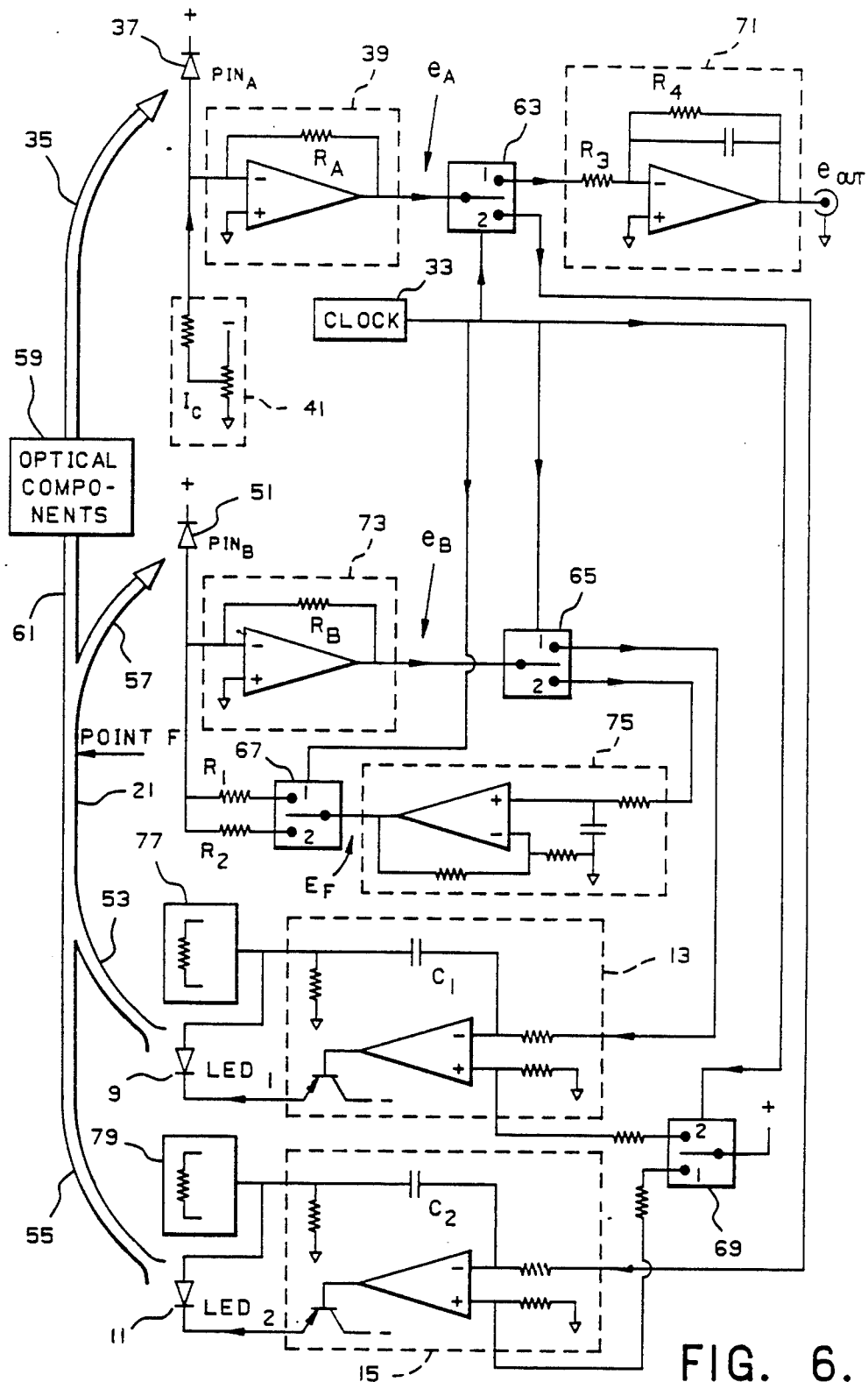
FIG. 6 is a schematic diagram of a practical circuit for implementing the system of FIG. 1.

FIG. 6 is a schematic circuit diagram for a simplified implementation of a circuit which is compatible with both elasto-optic and magneto-optic sensors and where light transmission is proportional to $(1 + \alpha(t))$ at wavelength $\lambda_1$, and is independent of stress or magnetic field respectively at $\lambda_2$. Where appropriate, components in FIG. 6 corresponding to those in FIG. 1 have been given the same reference character. Thus, LED 1, which generates light at wavelength $\lambda_1$, is identified by reference character 9 and is driven by current source 13, while LED 2 which produces light at $\lambda_2$ is identified by the reference character 11 and is activated by current source 15. Light from LED 1 enters leg 53 of coupler 21 while light from LED 2 is fed through leg 55. The light from the LEDs is transmitted to both the photodetector 51, through leg 57 of the coupler 21, and to the optical components 59 of the sensor, through leg 61. Light emerging from the optical components, which include the lenses, polarizer, sensing element and analyzer, is transmitted to the photodetector 37 through the fiber optic light guide 35.

The clock 33 drives four analog switches 63, 65, 67 and 69 at a multiplexing frequency sufficiently higher than the required bandwidth for the pressure gauge or direct current transformer to permit elimination of the switching frequency from the output waveform by the low pass amplifier 71. While not required in the general case, assume for the following discussion that the two non-overlapping time intervals T1 and T2 generated by the clock circuit 33 are equal in duration and follow each other without any time in between. Table 1 then defines the terms and conditions for both time intervals.

TABLE 1

| For Time Interval $T_1$ | For Time Interval $T_2$ | |
|---|---|---|
| On | Off | LED$_1$ (9) with wavelength $\lambda_1$. |
| Off | On | LED$_2$ (11) with wavelength $\lambda_2$. |
| P$_1$ | P$_2$ | Light intensity at Point F optical coupler (21). |
| $\beta_{1B}$ | $\beta_{2B}$ | Light transmission between Point F and PIN$_B$ (51). |
| C$_{1B}$ | C$_{2B}$ | Radiant sensitivity of PIN$_B$ (51) at $\lambda_1$ and $\lambda_2$ |

TABLE 1-continued

| For Time Interval $T_1$ | For Time Interval $T_2$ | |
|---|---|---|
| $e_{1B}$ | $e_{2B}$ | Instantaneous voltage at output of amplifier (73). |
| $\beta_{1A}$ | $\beta_{2A}$ | Light transmission between Point F and $PIN_A$ (37) in the absence of stress or magnetic field in the sensor. |
| $\beta_{1A}[1 + \alpha_1(t)]$ | $\beta_{2A}$ | Instantaneous light transmission between Point F and $PIN_A$ (37). |
| $C_{1A}$ | $C_{2A}$ | Radiant sensitivity of $PIN_A$ (37) at $\lambda_1$ and $\lambda_2$ respectively. |
| $e_{1A}$ | $e_{2A}$ | Instantaneous voltage at output of amplifier (39). |
| $E_F$ | $E_F$ | Voltage at the output of low pass amplifier (75). |

During time intervals of $T_2$, analog switch 69 applies a positive bias to the non-inverting input of the current source 13 thereby disabling it and turning OFF light source 9, $LED_1$. During this period, the previously stored charge on capacitor $C_1$ is retained because the inverting input of current source 13 is disconnected by analog switch 65. At the same time, analog switch 69 enables current source 15 and thereby turns ON light source 11 $LED_2$, to a level corresponding to the previously stored charge in capacitor $C_2$. Temperature controllers 77 and 79 are used to hold the junction temperatures at levels that are adjusted for their average currents. The constant junction temperatures are required for holding the wavelengths $\lambda_1$ and $\lambda_2$, and therefore the calibration of the unit, constant.

Depending on the response speed of the low pass circuit in current source 15, during a number of successive $T_2$ time intervals, the $LED_2$ light output level is adjusted by a negative feedback to force output $e_{2A}$ of current amplifier 39 to zero. The negative feedback loop consists of the optical sensor components 59, fiber optic elements 55, 21, 61, 35 and circuit elements 37, 39, 63, 15, and 11.

$$e_{2A} = R_A(P_2 \cdot \beta_{2A} \cdot - I_C) = 0$$

where $I_c$ is a constant calibrating current obtained from reference source 41. In the same time intervals $T_2$, the negative feedback loop composed of current amplifier 73 analog switches 65, 67 and the low pass amplifier 75 adjusts the output $E_F$ of the latter by forcing output $e_{2B}$ of current amplifier 73 toward zero. The passband of amplifier 75 is much lower than the frequency of clock circuit 33 and over a number of $T_2$ time intervals the follow relationship is obtained:

$$e_{2B} = R_B\left(P_2 \cdot \beta_{2B} \cdot C_{2B} - \frac{E_F}{R_2}\right) = 0 \text{ or}$$

$$E_F = R_2 \cdot P_2 \cdot \beta_{2B} \cdot C_{2B}$$

During time intervals $T_1$ analog switch 69 disables light source 11, $LED_2$, and enables light source 9, $LED_1$. with the other analog switches during these time intervals connected in the "1" position as indicated in FIG. 6, the negative feedback loop composed of fiber optic elements 53, 21, 57, curcuit elements 51, 73, 65, and current source 13 adjusts the light level of light source 9, $LED_1$ by forcing output $e_{1B}$ of current amplifier 73 toward zero and establishing the relationships:

$$e_{1B} = R_B\left(P_1 \cdot \beta_{1B} \cdot C_{1B} - \frac{E_F}{R_1}\right) = 0 \text{ and}$$

$$P_1 = \frac{E_F}{R_1 \cdot \beta_{1B} \cdot C_{1B}} = P_2 \frac{R_2}{R_1} \frac{\beta_{2B}}{\beta_{1B}} \frac{C_{2B}}{C_{1B}}$$

Instantaneous output $e_{1A}$ of current amplifier 39 during these $T_1$ time intervals is given by:

$$e_{1A} = R_A\{P_1 \cdot \beta_{1A} \cdot C_{1A}[1 + \alpha_1(t)] - I_c\} =$$

$$R_A I_C \left\{ \frac{\beta_{1A}}{\beta_{2A}} \frac{\beta_{2B}}{\beta_{1B}} \frac{C_{1A}}{C_{2B}} \frac{C_{2B}}{C_{1B}} \frac{R_2}{R_1} [1 + \alpha_1(t)] - 1 \right\}$$

The first two terms in the brackets represent ratios of optical transmission of the two wavelengths $\lambda_1$ and $\lambda_2$ by the same optical elements. Even while the optical transmission of these elements can change in time and due to vibrations, the fractional changes are independent of wavelength in a practical case and therefore these ratios remain constant. The next two terms represent ratios of radiant sensitivity at the two wavelengths $\lambda_1$ and $\lambda_2$ of the same photodetectors. Again, the ratios will remain constant while the radiant sensitivity of either or both photodetectors change in time. The dynamic range as well as the slow rate requirements for the current amplifier 39 are minimized if the value of $R_2$ is adjusted during initial calibration according to the equation:

$$R_2 = R_1 \frac{\beta_{2A}}{\beta_{1A}} \frac{\beta_{1B}}{\beta_{2B}} \frac{C_{2A}}{C_{1A}} \frac{C_{1B}}{C_{2B}}$$

and then $$E_{1A} = R_A I_c \alpha_1(t)$$

With this and the assumptions:
1. Switching transients between $T_1$ and $T_2$ can be neglected.
2. Durations of time intervals $T_1$ and $T_2$ are equal.
3. Cut off off frequency of low pass output amplifier 71 is sufficiently lower than the frequency of clock circuit 33 to eliminate steps in the output waveform.

Then the output voltage $e_{out}$ is given by:

$$e_{out} = -(R_4/R_3) R_A I_c \alpha_1(t)$$

Where $\alpha_1(t)$ is a function of the instantaneous stress or magnetic field in the sensor and the other terms represent fixed or adjustable calibration constants.

As used throughout, the term polarized light means light which is so polarized that the electrical signal generated in response thereto has a component which is proportional to the magnitude of the physical quantity to be measured, while the term unpolarized light is used to identify light which generates an electrical signal which is independent of the magnitude of the physical quantity. For example, in the case of the elasto-optic sensor, light of both wavelengths can be linearly polarized by the polarizar 27, but only light of one wavelength is circularly polarized by the ¼ wave plate 29 which is a ½ wave plate for light of the other wavelength. Since linearly polarized light is not affected by birefringence in the elasto-optic material, the electrical signal generated thereby will be independent of the magnitude of the physical quantity. Also, light of both wavelengths may be linearly polarized by polarizer 25B for passage through magneto-optic sensor 3B, but the analyzer 31B may be effective to detect polarization just at one of the wavelengths. In this case, also, light of the one wavelengths is not effectively polarized as the terms are used herein.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A method of measuring the magnitude of a physical quantity comprising the steps of:
   alternately passing polarized light and unpolarized light through an optical sensor which alters the polarization of the polarized light as a function of the magnitude of the selected physical quantity, but passes the unpolarized light unaffected by the magnitude of the physical quantity;
   converting light emerging from the optical sensor into an electrical signal having in response to the polarized light a component proportional to the magnitude of the selected physical quantity;
   maintaining the effective intensities of the polarized and unpolarized light in proportion such that the electrical signal generated in response to the unpolarized light and in response to the polarized light with a zero magnitude of the physical quantity, are substantially equal; and
   subtracting the electrical signal alternately generated in response to the unpolarized light from the electrical signal generated in response to the polarized light to generate an output signal proportional to the magnitude of the physical quantity.

2. The method of claim 1 wherein the step of subtracting the electrical signal generated in response to the unpolarized light from the electrical signal generated in response to the polarized light comprises the steps of:
   comparing the electrical signal generated in response to the unpolarized light to a reference signal;
   adjusting the intensity of the unpolarized light to make the electrical signal generated in response thereto substantially equal to said reference signal; and
   subtracting the reference signal from the electrical signal generated in response to the polarized light to generate said output signal proportional to the magnitude of the physical quantity.

3. The method of claim 1 wherein the step of alternatively passing polarized and unpolarized light through the optical sensor comprises the steps of:
   alternately generating light of a first wavelength and a second wavelength; and
   passing said light of said first and second wavelengths through a polarizer which is effective to polarize light of the first wavelength but ineffective to polarize light of the second wavelength.

4. The method of claim 3 wherein the step of maintaining the effective intensities of the polarized and unpolarized light in proportion comprises the steps of:
   measuring the intensity of the light generated at said first and second wavelengths; and
   adjusting the intensity of light generated at one wavelength in proportion to the intensity of light generated at the other wavelength such that the electrical signals generated in response to light at said first and second wavelengths for a zero magnitude of said physical quantity are substantially equal.

5. The method of claim 4 wherein light of said one wavelength, which is adjusted to maintain the intensity of light at the first and second wavelengths in said proportion, is light of said first wavelength and wherein said step of subtracting the electrical signal generated in response to light of the second wavelength from the electrical signal generated in response to light of the first wavelength comprises steps of:
   generating a reference signal;
   comparing said electrical signal to said reference signal to generate a difference signal;
   regulating the intensity of light generated at said second wavelength to drive the difference signal generated in response to light of the second wavelength to substantially zero; and
   using the difference signal generated in response to light of the first wavelength as said output signal proportional to the magnitude of said physical quantity.

6. The method of claim 5 wherein said physical quantity is a force, said optical sensor comprises elasto-optic material and said step of polarizing comprises circularly polarizing light of said first wavelength.

7. The method of claim 5 wherein said physical quantity is a dc electrical current, said optical sensor comprises magneto-optic material and said step of polarizing comprises linearly polarizing light of said first wavelength.

8. Apparatus for measuring the magnitude of a physical quantity, comprising:
   light source means for alternately generating polarized and unpolarized light;
   an optical sensor through which said polarized light and unpolarized light are alternately passed and which alters the polarization of the polarized light in proportion to the magnitude of said physical quantity while passing said unpolarized light unaltered by the magnitude of said physical quantity;
   means for converting light passed through the optical sensor into an electrical signal having in response to the polarized light a component proportional to the magnitude of the physical quantity;
   means for maintaining the intensity of the polarized and unpolarized light in proportion; such that the electrical signals generated in response to the unpolarized and the polarized light for a zero magnitude of the physical quantity are substantially equal, and
   means for generating an output signal proportional to the magnitude of the physical quantity as the difference between the electrical signal generated in response to the polarized and unpolarized light.

9. The apparatus of claim 8 wherein said light source means comprises:
   a first light source for generating light of a first wavelength;
   a second light source for generating light of a second wavelength;

a polarizer effective to polarize light of the first wavelength but not light of the second wavelength; and clock means for alternately activating said first and second light sources.

10. The apparatus of claim 9 wherein said means for maintaining the intensities of said polarized and unpolarized light in proportion comprise:

means for measuring the intensities of the light generated by the first and second light sources, and means for adjusting the intensity of the light generated by the first light source to a proportion of the intensity of the second light source such that the electrical signals generated in response to light from said first and second light sources are substantially equal for a zero magnitude of the physical quantity.

11. The apparatus of claim 10 wherein said means for generating an output signal comprise:

means for generating a reference signal;

means for generating a difference signal as the difference between said electrical signal and the reference signal, said means having first and second outputs at which said difference signal appears and responsive to said clock means to generate the difference signal at the first output when said clock means activates the first light source and at the second output when the clock means activates the second light source;

feedback means connected to the second output of the difference signal generating means and the second light source for adjusting the intensity of the light generated by the second light source to drive said difference signal to substantially zero; and means connected to the first output of the difference signal generating means to generate an output signal from the difference between the reference signal and the electrical signal generated in response to light from the first light source.

12. Apparatus for measuring a physical quantity comprising:

a first light source for generating light of a first wavelength;

a second light source for generating light of a second wavelength;

a polarizer effective to polarize light of the unpolarized first wavelength but not light of the second wavelength;

fiber optic light guide means for transmitting light from said first and second light sources to the polarizer;

clock means for alternately activating the first and second light sources;

an optical sensor through which polarized and unpolarized light from the polarizer is passed and which modifies the polarization of the polarized light of the first wavelength in proportion to the magnitude of the physical quantity but which passes the unpolarized light of the second wavelength unaffected by the magnitude of the physical quantity;

means for converting light passed through the sensor into an electrical signal having in response to light of the first wavelength a component proportional to the magnitude of the physical quantity;

means for comparing the intensities of light generated at the first and second wavelengths and for regulating the intensity of light generated at the first wavelength in proportion to light generated at the second wavelength such that the electrical signals generated in response to light of the first and second wavelengths for a zero magnitude of the physical quantity are substantially equal;

means for generating a reference signal;

means for comparing the electrical signal with the reference signal to generate a difference signal and under control of said clock means for presenting the difference signal at a first output when the first light source is activated and at a second output when the second light source is activated;

means for storing the difference signal presented at the first output of the comparing means when the first light source is activated as an output signal proportional to the magnitude of the physical quantity; and feedback means responsive to the difference signal presented at the second output of the comparing means when the second light source is activated to regulate the intensity of light generated thereby to drive the difference signal to substantially zero.

* * * * *